(12) United States Patent
Huang et al.

(10) Patent No.: US 12,334,164 B2
(45) Date of Patent: Jun. 17, 2025

(54) SHIFT REGISTER, GATE DRIVING CIRCUIT AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Yao Huang, Beijing (CN); Ming Hu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/705,560

(22) PCT Filed: Apr. 21, 2023

(86) PCT No.: PCT/CN2023/089909
§ 371 (c)(1),
(2) Date: Apr. 28, 2024

(87) PCT Pub. No.: WO2023/207808
PCT Pub. Date: Nov. 2, 2023

(65) Prior Publication Data
US 2025/0006284 A1    Jan. 2, 2025

(30) Foreign Application Priority Data
Apr. 24, 2022  (CN) .......................... 202210455761.0

(51) Int. Cl.
*G11C 19/28* (2006.01)
*G09G 3/3266* (2016.01)

(52) U.S. Cl.
CPC ........... *G11C 19/28* (2013.01); *G09G 3/3266* (2013.01); *G09G 2310/0286* (2013.01); *G09G 2310/08* (2013.01)

(58) Field of Classification Search
CPC ......... G09G 3/3266; G09G 2310/0286; G09G 2310/08; G11C 19/28
See application file for complete search history.

(56) References Cited

U.S. PATENT DOCUMENTS 11,430,365 B2 *  8/2022  Yuan ....................... G11C 19/28
11,615,728 B2 *  3/2023  Yuan .................... G11C 19/287
                                                   345/212

(Continued)

FOREIGN PATENT DOCUMENTS

CN    111462675 A    7/2020
CN    112669757 A    4/2021

(Continued)

OTHER PUBLICATIONS

International Search Report for PCT/CN2023/089909 Mailed Aug. 8, 2023.

*Primary Examiner* — Michael Pervan
(74) *Attorney, Agent, or Firm* — Ling Wu; Stephen Yang; Ling and Yang Intellectual Property

(57) ABSTRACT

Disclosed is a shift register, including an input module providing an input signal at an input signal end for a second node, a first output module, a second output module, a first control module, a second control module, a third control module, a fourth control module, and an energy storage module, wherein controlled by a voltage at the second node, the first output module providing a first power supply signal at a first power supply signal end for an output signal end, and, controlled by a voltage at a first node, the second output module providing a second power supply signal at a second power supply signal end for the output signal end. The first (Continued)

control module, the second control module, the third control module, the fourth control module and the energy storage module control potentials at the first node, a third node and a fourth node in cooperation.

20 Claims, 4 Drawing Sheets

(56) References Cited

U.S. PATENT DOCUMENTS

| | | | | |
|---|---|---|---|---|
| 11,615,729 | B2* | 3/2023 | Yuan | G11C 19/287 |
| | | | | 345/212 |
| 2022/0059001 | A1* | 2/2022 | Yuan | G11C 19/28 |
| 2022/0375381 | A1* | 11/2022 | Yuan | G11C 19/28 |
| 2022/0375382 | A1* | 11/2022 | Yuan | G11C 19/28 |

FOREIGN PATENT DOCUMENTS

| | | | |
|---|---|---|---|
| CN | 112687229 | A | 4/2021 |
| CN | 113889022 | A | 1/2022 |
| CN | 114822355 | A | 7/2022 |
| KR | 20060129881 | A1 | 12/2006 |

* cited by examiner

ND DISPLAY APPARATUS

SHIFT REGISTER, GATE DRIVING CIRCUIT AND DISPLAY APPARATUS

CROSS-REFERENCE TO RELATED APPLICATIONS

The present application is a U.S. National Phase Entry of International Application No. PCT/CN2023/089909 having an international filing date of Apr. 21, 2023, which claims priority to Chinese patent application No. 202210455761.0, filed to the CNIPA on Apr. 24, 2022, contents of the above-identified applications should be interpreted as being incorporated into the present application by reference.

TECHNICAL FIELD

Embodiments of the present disclosure relate to, but are not limited to, the field of display technologies, and in particular to a shift register, a gate drive circuit, and a display apparatus.

BACKGROUND

In a Gate Driver on Array (GOA) technology, a Thin Film Transistor (TFT) gate switch circuit is integrated on an array substrate of a display panel to form a drive for the display panel, thus saving wiring space of a Bonding region and a Fan-out region of an Integrated Circuit (IC), thereby achieving a narrow frame.

An oxide thin film transistor has attracted more and more attention due to its transparent material, a relatively simple fabrication process, and a low process temperature. For the oxide thin film transistor, it is necessary to design a new GOA circuit to adapt to characteristics of a relatively low carrier mobility of the oxide thin film transistor.

SUMMARY

The following is a summary of subject matters described herein in detail. The summary is not intended to limit the protection scope of claims.

An embodiment of the present disclosure provides a shift register, including an input module, a first output module, a second output module, a first control module, a second control module, a third control module, a fourth control module, and an energy storage module; the input module is connected with an input signal terminal, a first clock signal terminal, and a second node, and is configured to provide an input signal of the input signal terminal to the second node under control of a first clock signal of the first clock signal terminal; the first output module is connected with a first power supply signal terminal, the second node, and an output signal terminal, and is configured to provide a first power supply signal of the first power supply signal terminal to the output signal terminal under control of a voltage of the second node; the second output module is connected with a second power supply signal terminal, a first node, and the output signal terminal, and is configured to provide a second power supply signal of the second power supply signal terminal to the output signal terminal under control of a voltage of the first node; the first control module is connected with the second power supply signal terminal, the second node, and the first node, and is configured to provide the second power supply signal of the second power supply signal terminal to the first node under control of the voltage of the second node; the second control module is connected with the first clock signal terminal, a third node, and the first node, and is configured to provide the first clock signal of the first clock signal terminal to the first node under control of a voltage of the third node; the third control module is connected with the input signal terminal, the second power supply signal terminal, a second clock signal terminal, and the third node, and is configured to provide the second power supply signal of the second power supply signal terminal to the third node under control of the input signal of the input signal terminal, and to provide the second power supply signal of the second power supply signal terminal to the third node under control of a second clock signal of the second clock signal terminal; the fourth control module is connected with the first power supply signal terminal, the first clock signal terminal, the second power supply signal terminal, the second clock signal terminal, and a fourth node, and is configured to provide the first power supply signal of the first power supply signal terminal to the fourth node under control of the first clock signal of the first clock signal terminal, and to provide the second power supply signal of the second power supply signal terminal to the fourth node under control of the second clock signal of the second clock signal terminal; the energy storage module includes a first capacitor, and two ends of the first capacitor are respectively connected with the third node and the fourth node.

An embodiment of the present disclosure also provides a gate drive circuit, including N cascaded shift registers SR(i); wherein an output signal terminal of a k-th shift register SR(k) is connected with an input signal terminal of a (k+1)-th shift register SR(k+1); $1 \leq k \leq N-1$, $N>1$; the above shift register is adopted for at least one shift register SR(i) in the N shift registers; $1 \leq i \leq N$.

An embodiment of the present disclosure also provides a display apparatus, including the above gate drive circuit.

Other aspects may become apparent after accompanying drawings and detailed description are read and understood.

BRIEF DESCRIPTION OF DRAWINGS

Accompany drawings are used for providing further understanding of technical solutions of the present disclosure, and constitute a part of the specification. The accompany drawings, together with the embodiments of the present disclosure, are used for explaining the technical solutions of the present disclosure, and do not constitute limitations on the technical solutions of the present disclosure.

DETAILED DESCRIPTION

Figure 1:
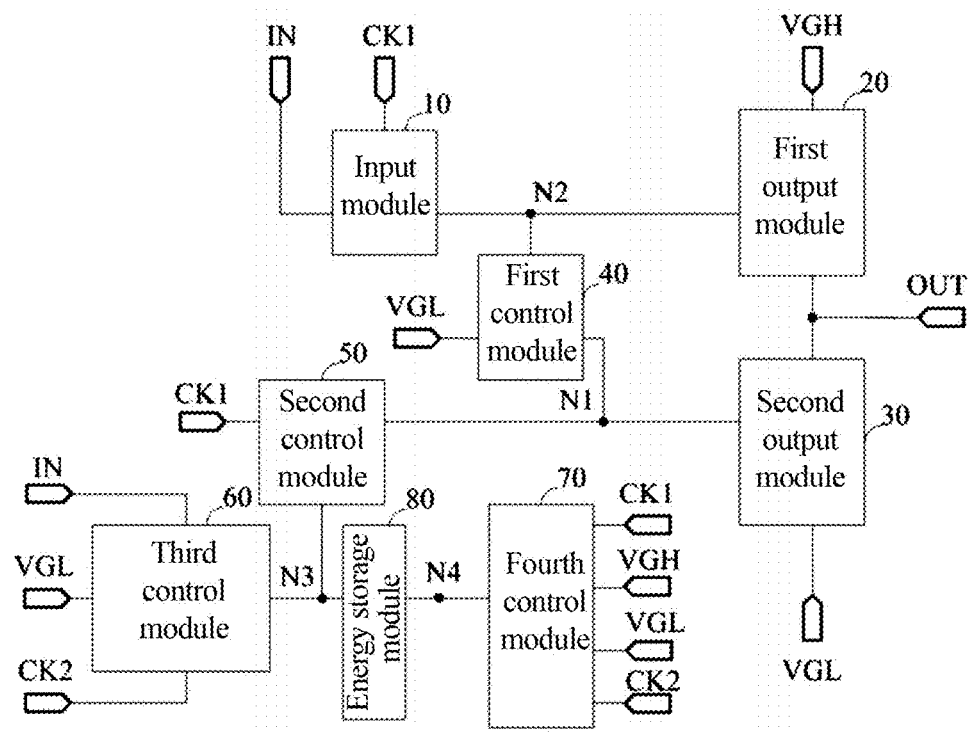
FIG. 1 is a schematic diagram of a structure of a shift register according to an embodiment of the present disclosure.

To make objectives, the technical solutions, and advantages of the present disclosure clearer, the embodiments of the present disclosure will be described in detail below in combination with the accompany drawings. It is to be noted that implementation modes may be implemented in multiple different forms. Those of ordinary skills in the art may easily understand such a fact that modes and contents may be transformed into various forms without departing from the purpose and scope of the present disclosure. Therefore, the present disclosure should not be explained as being limited to contents recorded in following implementation modes only. The embodiments and features in the embodiments of the present disclosure may be randomly combined with each other if there is no conflict.

In the accompanying drawings, a size of each constituent element, a thickness of a layer, or a region may be exaggerated sometimes for clarity. Therefore, one mode of the present disclosure is not always limited to the size, and a shape and a size of each component in the drawings do not reflect an actual scale. In addition, the accompanying drawings schematically illustrate ideal examples, and one mode of the present disclosure is not limited to shapes, numerical values, or the like shown in the drawings.

Ordinal numerals "first", "second", "third", etc., in the specification are set not to form limits in numbers but only to avoid confusion between constituent elements.

In the specification, unless otherwise specified and defined, terms "mounting", "mutual connection", and "connection" should be understood in a broad sense. For example, a connection may be a fixed connection, or a detachable connection, or an integral connection; it may be a mechanical connection or an electrical connection; it may be a direct connection, or an indirect connection through middleware, or internal communication inside two elements. Those of ordinary skills in the art may understand specific meanings of the above terms in the present disclosure according to specific situations.

In the specification, a transistor refers to an element which at least includes three terminals, i.e., a gate, a drain, and a source. The source and the drain of the transistor are symmetrical, and in a case that transistors with opposite polarities are used, or in a case that a direction of a current is changed during operation of a circuit, or the like, functions of the source and the drain are sometimes interchangeable. In an embodiment of the present disclosure, one of the source and the drain is referred to as a first electrode, the other of the source and the drain is referred to as a second electrode, and the gate is referred to as a control electrode.

In the specification, an "electrical connection" includes a case that constituent elements are connected together through an element with a certain electrical action. An "element with a certain electrical action" is not particularly limited as long as electrical signals between the connected constituent elements may be sent and received. Examples of the "element with the certain electrical action" not only include an electrode and a wiring, but also include a switching element such as a transistor, a resistor, an inductor, a capacitor, another element with various functions, etc.

In following examples, a case that a drive transistor is an N-type thin film transistor is taken for description, and other transistors are of a same type as or different types from the drive transistor according to a circuit design. Similarly, in other embodiments, the drive transistor may also be shown as a P-type thin film transistor. Those of skill in the art can understand that the technical solutions of the present disclosure can also be achieved by changing types of other transistors accordingly and inverting each drive signal and level signal (and/or making other additional adaptive modifications thereto).

An embodiment of the present disclosure provides a shift register. As shown in FIG. 1, the shift register according to the embodiment of the present disclosure includes an input module 10, a first output module 20, a second output module 30, a first control module 40, a second control module 50, a third control module 60, a fourth control module 70, and an energy storage module 80.

The input module is connected with an input signal terminal IN, a first clock signal terminal CK1, and a second node N2, and is configured to provide an input signal of the input signal terminal to the second node under control of a first clock signal of the first clock signal terminal.

The first output module is connected with a first power supply signal terminal VGH, the second node N2, and an output signal terminal OUT, and is configured to provide a first power supply signal of the first power supply signal terminal to the output signal terminal under control of a voltage of the second node.

The second output module is connected with a second power supply signal terminal VGL, a first node N1, and the output signal terminal OUT, and is configured to supply a second power supply signal of the second power supply signal terminal to the output signal terminal under control of a voltage of the first node.

The first control module is connected with the second power supply signal terminal VGL, the second node N2, and the first node N1, and is configured to provide the second power supply signal of the second power supply signal terminal to the first node under control of the voltage of the second node.

The second control module is connected with the first clock signal terminal CK1, a third node N3, and the first node N1, and is configured to provide the first clock signal of the first clock signal terminal to the first node under control of a voltage of the third node.

The third control module is connected with the input signal terminal IN, the second power supply signal terminal VGL, a second clock signal terminal CK2, and the third node N3, and is configured to provide the second power supply signal of the second power supply signal terminal to the third node under control of the input signal of the input signal terminal, and to provide the second power supply signal of the second power supply signal terminal to the third node under control of a second clock signal of the second clock signal terminal.

The fourth control module is connected with the first power supply signal terminal VGH, the first clock signal terminal CK1, the second power supply signal terminal VGL, the second clock signal terminal CK2, and a fourth node N4, and is configured to provide the first power supply signal of the first power supply signal terminal to the fourth node under control of the first clock signal of the first clock signal terminal, and to provide the second power supply signal of the second power supply signal terminal to the fourth node under control of the second clock signal of the second clock signal terminal.

The energy storage module includes a first capacitor C1, and two ends of the first capacitor are respectively connected with the third node and the fourth node.

The shift register according to the above embodiment includes an input module, a first output module, a second output module, a first control module, a second control module, a third control module, a fourth control module, and an energy storage module; the input module provides an input signal of an input signal terminal to a second node, the first output module provides a first power supply signal of a first power supply signal terminal to an output signal terminal under control of a voltage of the second node, the second output module provides a second power supply signal of a second power supply signal terminal to the output signal terminal under control of a voltage of a first node, the first control module and the second control module control the voltage of the first node, the third control module controls a voltage of a third node, the fourth control module controls a voltage of a fourth node, cooperation of the four control modules and the energy storage module can make a node potential jump in time, shorten time of a rising edge and a falling edge of an output pulse signal, and make an output waveform meet requirements.

Figure 2:
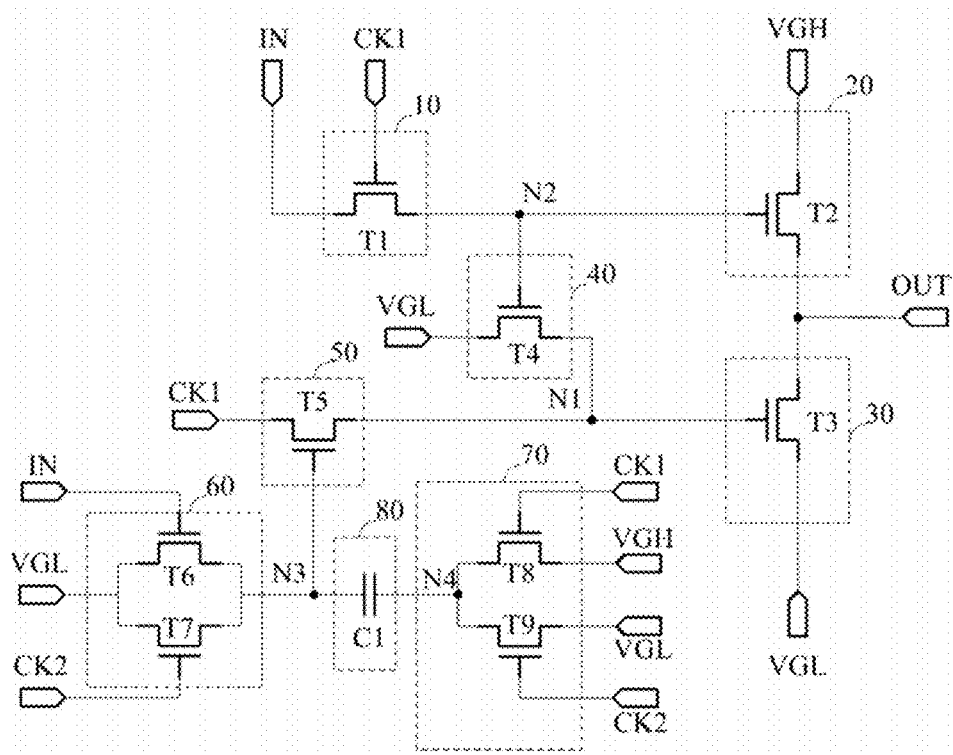
FIG. 2 is a schematic diagram of an equivalent circuit of a shift register according to an embodiment of the present disclosure.

FIG. 2 provides an equivalent circuit diagram of a shift register.

As shown in FIG. 2, in some exemplary implementation modes, the input module includes a first transistor T1. A control electrode of the first transistor is connected with a first clock signal terminal. A first electrode of the first transistor is connected with an input signal terminal. And a second electrode of the first transistor is connected with a second node.

As shown in FIG. 2, in some exemplary implementation modes, the first output module includes a second transistor T2. A control electrode of the second transistor is connected with the second node. A first electrode of the second transistor is connected with a first power supply signal terminal. And a second electrode of the second transistor is connected with an output signal terminal.

As shown in FIG. 2, in some exemplary implementation modes, the second output module includes a third transistor T3. A control electrode of the third transistor is connected with a first node. A first electrode of the third transistor is connected with a second power supply signal terminal. And a second electrode of the third transistor is connected with the output signal terminal.

As shown in FIG. 2, in some exemplary implementation modes, the first control module includes a fourth transistor T4. A control electrode of the fourth transistor is connected with the second node. A first electrode of the fourth transistor is connected with the second power supply signal terminal. A second electrode of the fourth transistor is connected with the first node.

As shown in FIG. 2, in some exemplary implementation modes, the second control module includes a fifth transistor T5. A control electrode of the fifth transistor is connected with a third node. A first electrode of the fifth transistor is connected with the first clock signal terminal. And a second electrode of the fifth transistor is connected with the first node.

As shown in FIG. 2, in some exemplary implementation modes, the third control module includes a sixth transistor and a seventh transistor. A control electrode of the sixth transistor is connected with the input signal terminal. A first electrode of the sixth transistor is connected with the second power supply signal terminal. A second electrode of the sixth transistor is connected with the third node. A control electrode of the seventh transistor is connected with the second clock signal terminal. A first electrode of the seventh transistor is connected with the second power supply signal terminal. And a second electrode of the seventh transistor is connected with the third node.

As shown in FIG. 2, in some exemplary implementation modes, the fourth control module includes an eighth transistor and a ninth transistor. A control electrode of the eighth transistor is connected with the first clock signal terminal. A first electrode of the eighth transistor is connected with the first power supply signal terminal. A second electrode of the eighth transistor is connected with a fourth node. A control electrode of the ninth transistor is connected with the second clock signal terminal. A first electrode of the ninth transistor is connected with the second power supply signal terminal. And a second electrode of the ninth transistor is connected with the fourth node.

Figure 3:
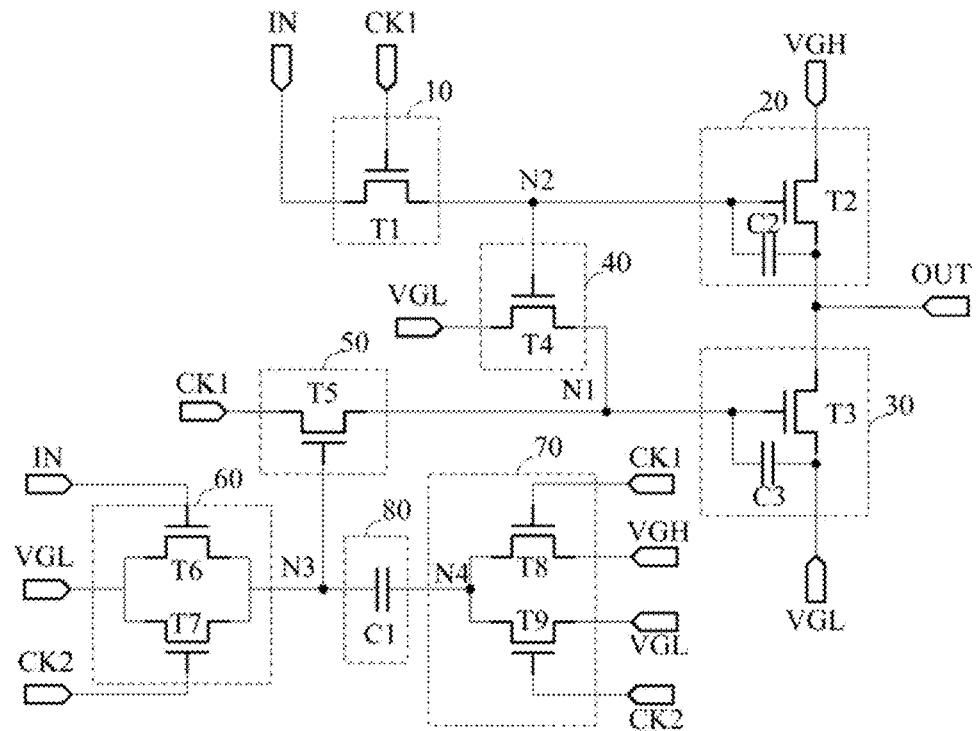
FIG. 3 is a schematic diagram of an equivalent circuit of another shift register (including a second capacitor and a third capacitor) according to an embodiment of the present disclosure.

FIG. 3 provides an equivalent circuit diagram of another shift register.

As shown in FIG. 3, in some exemplary implementation modes, the first output module further includes a second capacitor C2. One end of the second capacitor is connected with the control electrode of the second transistor. And the other end of the second capacitor is connected with the second electrode of the second transistor. The second capacitor is bridged between the control electrode and the second electrode of the second transistor to stabilize a potential of the control electrode of the second transistor.

As shown in FIG. 3, in some exemplary implementation modes, the second output module further includes a third capacitor C3. One end of the third capacitor is connected with the control electrode of the third transistor. And the other end of the third capacitor is connected with the first electrode of the third transistor. The third capacitor is bridged between the control electrode and the first electrode of the third transistor, to stabilize the potential of the control electrode of the third transistor.

Figure 4:
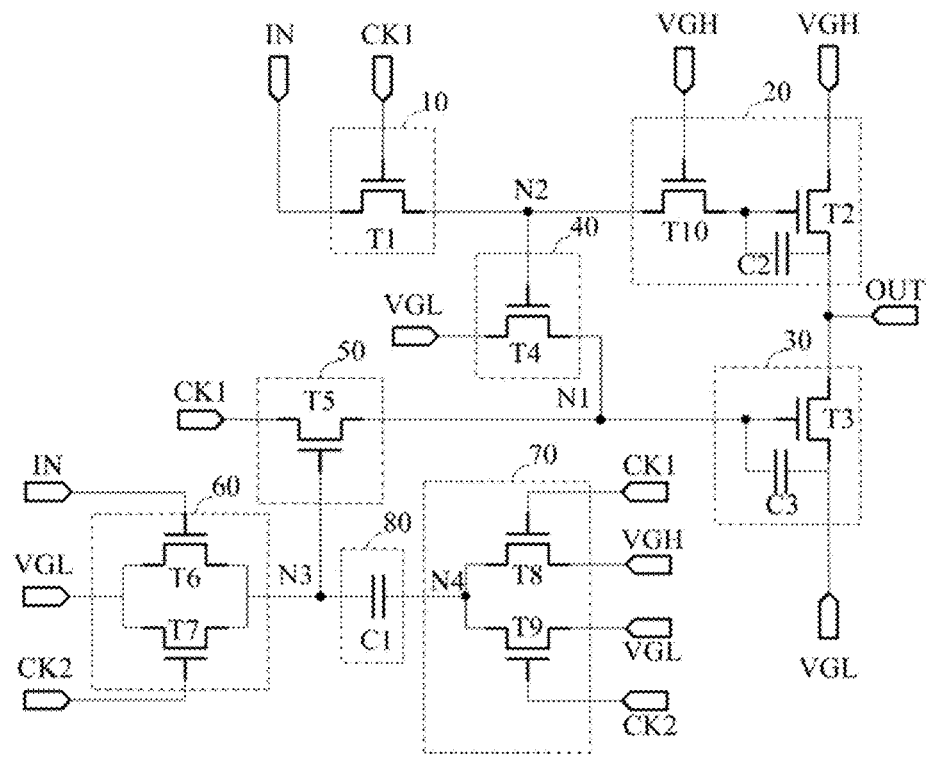
FIG. 4 is a schematic diagram of an equivalent circuit of another shift register (including a tenth transistor) according to an embodiment of the present disclosure.

FIG. 4 provides an equivalent circuit diagram of another shift register.

As shown in FIG. 4, in some exemplary implementation modes, the first output module further includes a tenth transistor T10. A control electrode of the tenth transistor is connected with the first power supply signal terminal. A first electrode of the tenth transistor is connected with the second node. And a second electrode of the tenth transistor is connected with the control electrode of the second transistor. A tenth transistor is disposed between the second node and the control electrode of the second transistor, to stabilize a potential of the control electrode of the second transistor.

In some exemplary implementation modes, all transistors in the shift register are N-type transistors.

In some exemplary implementation modes, when all transistors in the shift register are N-type transistors, one work cycle of the shift register includes following periods: a first period, a second period, a third period, a fourth period, and a fifth period and a sixth period which appear alternately for many times.

The first power supply signal and the second power supply signal are Direct Current (DC) signals. The first power supply signal is a high-level signal. The second power supply signal is a low-level signal. The input signal is a pulse signal. The first clock signal and the second clock signal are periodic pulse signals. The input signal is a high-level signal during the first period and the second period and is a low-level signal during other periods. The first clock signal is a low-level signal during the first period, the third period, and the fifth period, and is a high-level signal during the second period, the fourth period, and the sixth period. The second clock signal is a high-level signal during the first period, the third period, and the fifth period, and is a low-level signal during the second period, the fourth period, and the sixth period.

In some exemplary implementation modes, all transistors in the shift register are oxide thin film transistors. A carrier mobility of an oxide thin film transistor is relatively low. Cooperation of the four control modules and the energy storage module can make a node potential jump in time, shorten time of a rising edge and a falling edge of an output pulse signal, and make an output waveform meet requirements.

Below, a working process of the shift register is explained in combination with a signal timing diagram.

Figure 5:
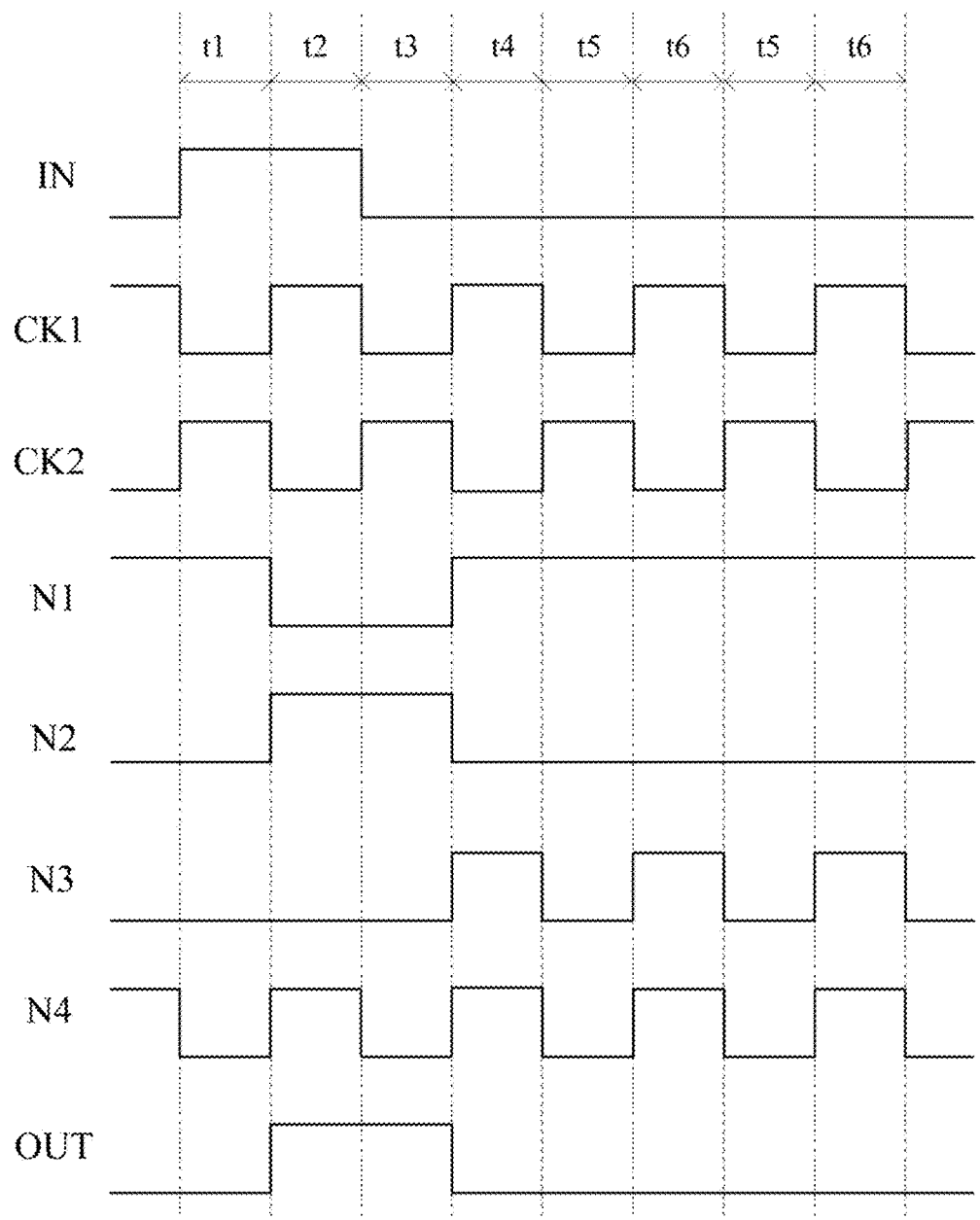
FIG. 5 is a signal timing diagram of a shift register according to an embodiment of the present disclosure.

FIG. 5 provides a signal timing diagram of a shift register. For the shift register, any one of structures shown in FIG. 2 to FIG. 4 is adopted. All transistors are N-type transistors. A first power supply signal terminal provides a first power supply signal. A second power supply signal terminal provides a second power supply signal. A first clock signal terminal provides a first clock signal. A second clock signal terminal provides a second clock signal. An input signal terminal provides an input signal. An output signal terminal provides an output signal. The first power supply signal and the second power supply signal are DC signals. The input signal is a pulse signal. The first clock signal and the second clock signal are periodic pulse signals. And the first clock signal and the second clock signal have opposite phases.

For an N-type transistor, the transistor is turned on when a voltage of a gate of the transistor (control electrode) is higher than a turn-on voltage, and the transistor is turned off when the voltage of the gate of the transistor is lower than the turn-on voltage. A high-level signal is a signal higher than a turn-on voltage of the transistor, and a low-level signal is a signal lower than the turn-on voltage of the transistor. For example, the first power supply signal is a high-level signal and the second power supply signal is a low-level signal.

A work cycle of the shift register may include following periods: a first period (t1), a second period (t2), a third period (t3), a fourth period (t4), and a fifth period (t5) and a sixth period (t6) which appear alternately for many times.

(1) The First Period (t1 Period)

The input signal is a high-level signal, the first clock signal is a low-level signal, and the second clock signal is a high-level signal.

The first clock signal is a low-level signal, the first transistor is turned off, and the second node maintains a potential of a previous period (t5), and the potential of the previous period is at a low level. The potential of the second node is at a low level, and the second transistor is turned off.

The input signal is a high-level signal, the sixth transistor is turned on, and the second power supply signal is provided to the third node. The second clock signal is a high-level signal, the seventh transistor is turned on, and the second power supply signal is provided to the third node. As the second power supply signal is a low-level signal, a potential of the third node is at a low level.

The first clock signal is a low-level signal, and the eighth transistor is turned off. The second clock signal is a high-level signal, the ninth transistor is turned on, and the second power supply signal is provided to the fourth node. As the second power supply signal is a low-level signal, a potential of the fourth node is at a low level.

As the second node is at a low level, the fourth transistor is turned off. As the third node is at a low level, the fifth transistor is turned off. The first node N1 maintains a potential of a previous period (t5), and the potential of the previous period is at a high level.

The potential of the first node is at a high level, the third transistor is turned on, and the second power supply signal is provided to the output signal terminal. As the second power supply signal is a low-level signal, an output signal output by the output signal terminal is a low-level signal. When the third capacitor is bridged between the control electrode and the first electrode of the third transistor, the first node charges the third capacitor.

(2) The Second Period (t2 Period)

The input signal is a high-level signal, the first clock signal is a high-level signal, and the second clock signal is a low-level signal.

The first clock signal is a high-level signal, the first transistor is turned on, and the input signal is provided to the second node. The input signal is a high-level signal, a potential of the second node jumps from a low level to a high level, the second transistor changes from off to on, and the first power supply signal is provided to the output signal terminal. As the first power supply signal is a high-level signal, an output signal output by the output signal terminal jumps from a low level to a high level.

The input signal is a high-level signal, the sixth transistor is turned on, and the second power supply signal is provided to the third node. The second clock signal is a low-level signal, and the seventh transistor is turned off. As the second power supply signal is a low-level signal, a potential of the third node continues to be kept at a low level.

The first clock signal is a high-level signal, the eighth transistor is turned on, and the first power supply signal is provided to the fourth node. The second clock signal is a low-level signal, and the ninth transistor is turned off. As the first power supply signal is a high-level signal, a potential of the fourth node is at a high level. The potential of the fourth node is at a high level, the potential of the third node is at a low level, the fourth node charges the first capacitor.

The second node is at a high level, the fourth transistor is turned on, and a second power supply signal is provided to the first node. The third node is at a low level, and the fifth transistor is turned off. As the second power supply signal is a low-level signal, the potential of the first node jumps from a high level to a low level, and the third transistor changes from on to off. Keeping the potential of the third node at a low level enables the fifth transistor to be reliably kept off, so that potential jump of the first node is only influenced by the second node, and potential jump of the second node synchronizes the turn-off of the third transistor and the turn-on of the second transistor, thus shortening voltage rise time of the output signal.

(3) The Third Period (t3 Period)

The input signal is a low-level signal, the first clock signal is a low-level signal, and the second clock signal is a high-level signal.

The first clock signal is a low-level signal, and the first transistor is turned off. The second node maintains a potential of a previous period (t2), and the potential of the previous period is at a high level. The potential of the second node is a high level, the second transistor continues to be kept on, and the output signal output by the output signal terminal continues to maintain at a high level. When the second capacitor is bridged between the control electrode and the second electrode of the second transistor, the second capacitor can maintain a high level of the second node.

The input signal is a low-level signal, and the sixth transistor is turned off. The second clock signal is a high-level signal, the seventh transistor is turned on, and the second power supply signal is provided to the third node. As the second power supply signal is a low-level signal, the potential of the third node continues to be kept at a low level.

The first clock signal is a low-level signal, and the eighth transistor is turned off. The second clock signal is a high-level signal, the ninth transistor is turned on, and the second power supply signal is provided to the fourth node. As the second power supply signal is a low-level signal, a potential of the fourth node is at a low level.

The potential of the second node continues to be kept at a high level, and the fourth transistor continues to be turned on. The potential of the third node continues to be kept at a low level, and the fifth transistor continues to remain off. The potential of the first node continues to be kept at a low level, and the third transistor continues to remain off.

(4) The Fourth Period (t4 Period)

The input signal is a low-level signal, the first clock signal is a high-level signal, and the second clock signal is a low-level signal.

The first clock signal is a high-level signal, the first transistor is turned on, and the input signal is provided to the second node. The input signal is a low-level signal, the potential of the second node jumps from a high level to a low level, and the second transistor changes from on to off.

The input signal is a low-level signal, and the sixth transistor is turned off. The second clock signal is a low-level signal, and the seventh transistor is turned off.

The first clock signal is a high-level signal, the eighth transistor is turned on, and the first power supply signal is provided to the fourth node. The second clock signal is a low-level signal, and the ninth transistor is turned off. As the first power supply signal is a high-level signal, the potential of the fourth node changes from a low level to a high level. The potential of the fourth node jumps from a low level to a high level. Under an action of the first capacitor, the potential of the third node jumps with the potential of the fourth node, from a low level to a high level.

The second node is at a low level, and the fourth transistor is turned off. The third node is at a high level, the fifth transistor is turned on, and the first clock signal is provided to the first node. As the first clock signal is a high-level signal, the potential of the first node jumps from a low level to a high level, the third transistor changes from off to on, and the second power supply signal is provided to the output signal terminal. As the second power supply signal is a low-level signal, the output signal output by the output signal terminal jumps from a high level to a low level. When the third capacitor is bridged between the control electrode and the first electrode of the third transistor, the first node charges the third capacitor.

After the fourth period, the fifth period and the sixth period appear alternately for many times until the end of this work cycle.

(5) The Fifth Period (t5 Period)

The input signal is a low-level signal, the first clock signal is a low-level signal, and the second clock signal is a high-level signal.

The first clock signal is a low-level signal, and the first transistor is turned off. The second node maintains a potential of a previous period (t4), and the potential of the previous period is at a low level. The potential of the second node is at a low level, and the second transistor continues to remain off.

The input signal is a low-level signal, and the sixth transistor is turned off. The second clock signal is a high-level signal, the seventh transistor is turned on, and the second power supply signal is provided to the third node. As the second power supply signal is a low-level signal, the potential of the third node jumps from a high level to a low level.

The first clock signal is a low-level signal, and the eighth transistor is turned off. The second clock signal is a high-level signal, the ninth transistor is turned on, and the second power supply signal is provided to the fourth node. As the second power supply signal is a low-level signal, the potential of the fourth node is at a low level.

The potential of the second node continues to be kept at a low level, and the fourth transistor continues to remain off. The potential of the third node jumps from a high level to a low level, and the fifth transistor changes from on to off. The potential of the first node maintains a potential of a previous period (t4), and the potential of the previous period is at a high level. The potential of the first node is at a high level, the second transistor continues to remain on, and the output signal of the output signal terminal is kept at a low level.

(6) The Sixth Period (t6 Period)

The input signal is a low-level signal, the first clock signal is a high-level signal, and the second clock signal is a low-level signal.

The first clock signal is a high-level signal, the first transistor is turned on, and the input signal is provided to the second node. The input signal is a low-level signal, the potential of the second node is kept at a low level, and the second transistor continues to remain off.

The input signal is a low-level signal, and the sixth transistor is turned off. The second clock signal is a low-level signal, and the seventh transistor is turned off.

The first clock signal is a high-level signal, the eighth transistor is turned on, and the first power supply signal is provided to the fourth node. The second clock signal is a low-level signal, and the ninth transistor is turned off. As the first power supply signal is a high-level signal, the potential of the fourth node jumps from a low level to a high level. The potential of the fourth node jumps from a low level to a high level, under an action of the first capacitor, the potential of the third node jumps with the potential of the fourth node, from a low level to a high level.

The third node is at a high level, the fifth transistor is turned on, and the first clock signal is provided to the first node. As the first clock signal is a high-level signal, the potential of the first node continues to be kept at a high level, the third transistor continues to remain on, and the output signal of the output signal terminal continues to be kept at a low level.

Figure 6:
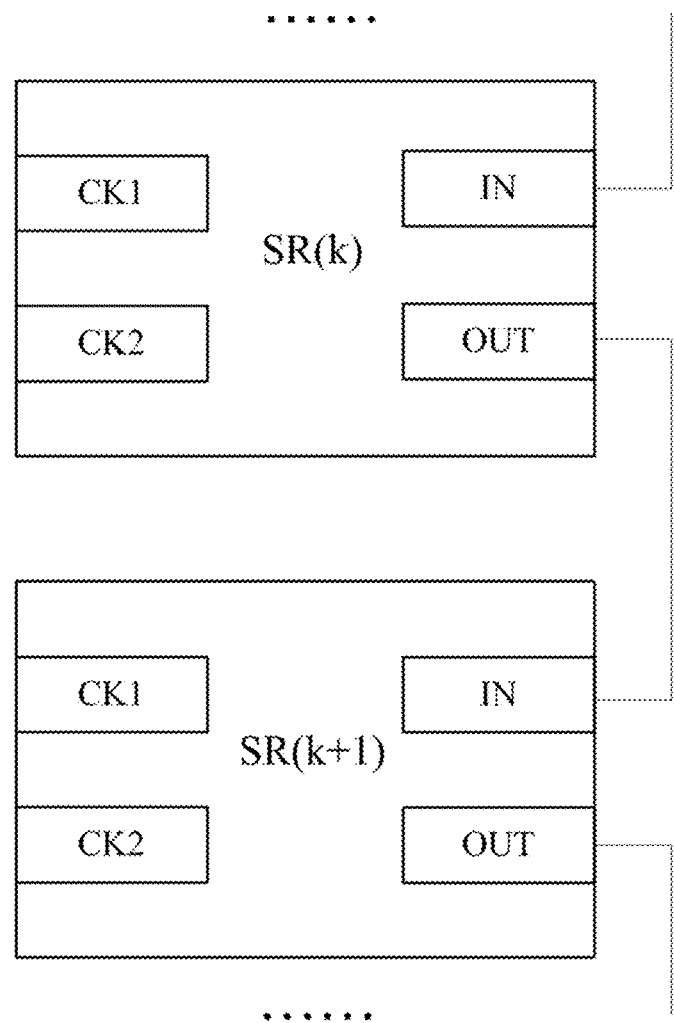
FIG. 6 is a schematic diagram of a cascade structure of a gate drive circuit according to an embodiment of the present disclosure.

As shown in FIG. 6, an embodiment of the present disclosure also provides a gate drive circuit including N cascaded shift registers SR(i); an output signal terminal of a k-th shift register SR(k) is connected with an input signal terminal of a (k+1)-th shift register SR(k+1); $1 \leq k \leq N-1$, $N>1$; the shift register of the above embodiment is adopted for at least one shift register SR(i) in the N shift registers; $1 \leq i \leq N$.

The above gate drive circuit may be connected with a pixel drive circuit of a display panel, and is configured to provide various control signals, such as a line scan signal and a reset signal, to the pixel drive circuit.

The display panel includes an Organic Light Emitting Diode (OLED) display panel.

An embodiment of the present disclosure also provides a display apparatus, including the above gate drive circuit.

The display apparatus may be any product or component with a display function, such as a mobile phone, a tablet computer, a television, a display, a laptop computer, a digital photo frame, and a navigator. Other essential components of the display apparatus should be understood as being included in the display apparatus by those of ordinary skill in the art, which will not be described herein in detail, and should not be regarded as limitations on the present disclosure.

Although implementation modes disclosed in the present disclosure are as above, contents described are only implementation modes for facilitating understanding the present disclosure and are not used for limiting the present disclosure. Any skilled person in the art to which the present disclosure pertains may make any modifications and alterations in forms and details of implementation without departing from the spirit and scope of the present disclosure. However, the patent protection scope of the present disclosure should be subject to the scope defined in the appended claims.

The invention claimed is:

1. A shift register, comprising: an input module, a first output module, a second output module, a first control module, a second control module, a third control module, a fourth control module, and an energy storage module;
the input module is connected with an input signal terminal, a first clock signal terminal, and a second node, and is configured to provide an input signal of the input signal terminal to the second node under control of a first clock signal of the first clock signal terminal;
the first output module is connected with a first power supply signal terminal, the second node, and an output signal terminal, and is configured to provide a first power supply signal of the first power supply signal terminal to the output signal terminal under control of a voltage of the second node;
the second output module is connected with a second power supply signal terminal, a first node, and the output signal terminal, and is configured to provide a second power supply signal of the second power supply signal terminal to the output signal terminal under control of a voltage of the first node;
the first control module is connected with the second power supply signal terminal, the second node, and the first node, and is configured to provide the second power supply signal of the second power supply signal terminal to the first node under control of the voltage of the second node;
the second control module connected with the first clock signal terminal, a third node, and the first node, and is configured to provide the first clock signal of the first clock signal terminal to the first node under control of a voltage of the third node;
the third control module is connected with the input signal terminal, the second power supply signal terminal, a second clock signal terminal, and the third node, and is configured to provide the second power supply signal of the second power supply signal terminal to the third node under control of the input signal of the input signal terminal, and to provide the second power supply signal of the second power supply signal terminal to the third node under control of a second clock signal of the second clock signal terminal;
the fourth control module is connected with the first power supply signal terminal, the first clock signal terminal, the second power supply signal terminal, the second clock signal terminal, and a fourth node, and is configured to provide the first power supply signal of the first power supply signal terminal to the fourth node under control of the first clock signal of the first clock signal terminal, and to provide the second power supply signal of the second power supply signal terminal to the fourth node under control of the second clock signal of the second clock signal terminal;
the energy storage module comprises a first capacitor, and two ends of the first capacitor are respectively connected with the third node and the fourth node.

2. The shift register according to claim 1, wherein
the input module comprises a first transistor, a control electrode of the first transistor is connected with the first clock signal terminal, a first electrode of the first transistor is connected with the input signal terminal, and a second electrode of the first transistor is connected with the second node;
the first output module comprises a second transistor, a control electrode of the second transistor is connected with the second node, a first electrode of the second transistor is connected with the first power supply signal terminal, and a second electrode of the second transistor is connected with the output signal terminal;
the second output module comprises a third transistor, a control electrode of the third transistor is connected with the first node, a first electrode of the third transistor is connected with the second power supply signal terminal, and a second electrode of the third transistor is connected with the output signal terminal.

3. The shift register according to claim 2, wherein
the first output module further comprises a second capacitor, one end of the second capacitor is connected with the control electrode of the second transistor, and the other end of the second capacitor is connected with the second electrode of the second transistor;
the second output module further comprises a third capacitor, one end of the third capacitor is connected with the control electrode of the third transistor, and the other end of the third capacitor is connected with the first electrode of the third transistor.

4. The shift register according to claim 2, wherein
the first output module further comprises a tenth transistor, a control electrode of the tenth transistor is connected with the first power supply signal terminal, a first electrode of the tenth transistor is connected with the second node, and a second electrode of the tenth transistor is connected with the control electrode of the second transistor.

5. The shift register according to claim 2, wherein
all transistors comprised in the shift register are oxide thin film transistors.

6. The shift register according to claim 2, wherein
when all transistors in the shift register are N-type transistors, one work cycle of the shift register comprises following periods: a first period, a second period, a third period, a fourth period, and a fifth period and a sixth period which appear alternately for many times;
the first power supply signal and the second power supply signal are Direct Current (DC) signals, the first power supply signal is a high-level signal, the second power supply signal is a low-level signal, the input signal is a pulse signal, and the first clock signal and the second clock signal are periodic pulse signals; the input signal is a high-level signal during the first period and the second period and is a low-level signal during other periods; the first clock signal is a low-level signal during the first period, the third period, and the fifth period and is a high-level signal during the second period, the fourth period, and the sixth period; the second clock signal is a high-level signal during the first period, the third period, and the fifth period and is a low-level signal during the second period, the fourth period, and the sixth period.

7. A gate drive circuit, comprising: N cascaded shift registers SR(i); wherein an output signal terminal of a k-th shift register SR(k) is connected with an input signal terminal of a (k+1)-th shift register SR(k+1); $1 \leq k \leq N-1$, $N>1$; a shift register according to claim 2 is adopted for at least one shift register SR(i) in the N shift registers; 1≤i≤N.

8. The shift register according to claim 1, wherein
the first control module comprises a fourth transistor, a control electrode of the fourth transistor is connected with the second node, a first electrode of the fourth transistor is connected with the second power supply signal terminal, and a second electrode of the fourth transistor is connected with the first node;
the second control module comprises a fifth transistor, a control electrode of the fifth transistor is connected with the third node, a first electrode of the fifth transistor is connected with the first clock signal terminal, and a second electrode of the fifth transistor is connected with the first node.

9. The shift register according to claim 8, wherein
all transistors comprised in the shift register are oxide thin film transistors.

10. The shift register according to claim 8, wherein
when all transistors in the shift register are N-type transistors, one work cycle of the shift register comprises following periods: a first period, a second period, a third period, a fourth period, and a fifth period and a sixth period which appear alternately for many times;
the first power supply signal and the second power supply signal are Direct Current (DC) signals, the first power supply signal is a high-level signal, the second power supply signal is a low-level signal, the input signal is a pulse signal, and the first clock signal and the second clock signal are periodic pulse signals; the input signal is a high-level signal during the first period and the second period and is a low-level signal during other periods; the first clock signal is a low-level signal during the first period, the third period, and the fifth period and is a high-level signal during the second period, the fourth period, and the sixth period; the second clock signal is a high-level signal during the first period, the third period, and the fifth period and is a low-level signal during the second period, the fourth period, and the sixth period.

11. A gate drive circuit, comprising: N cascaded shift registers SR(i); wherein an output signal terminal of a k-th shift register SR(k) is connected with an input signal terminal of a (k+1)-th shift register SR(k+1); 1≤k≤N−1, N>1; a shift register according to claim 8 is adopted for at least one shift register SR(i) in the N shift registers; 1≤i≤N.

12. The shift register according to claim 1, wherein
the third control module comprises a sixth transistor and a seventh transistor, a control electrode of the sixth transistor is connected with the input signal terminal, a first electrode of the sixth transistor is connected with the second power supply signal terminal, a second electrode of the sixth transistor is connected with the third node, a control electrode of the seventh transistor is connected with the second clock signal terminal, a first electrode of the seventh transistor is connected with the second power supply signal terminal, and a second electrode of the seventh transistor is connected with the third node.

13. The shift register according to claim 12, wherein
all transistors comprised in the shift register are oxide thin film transistors.

14. The shift register according to claim 12, wherein
when all transistors in the shift register are N-type transistors, one work cycle of the shift register comprises following periods: a first period, a second period, a third period, a fourth period, and a fifth period and a sixth period which appear alternately for many times;
the first power supply signal and the second power supply signal are Direct Current (DC) signals, the first power supply signal is a high-level signal, the second power supply signal is a low-level signal, the input signal is a pulse signal, and the first clock signal and the second clock signal are periodic pulse signals; the input signal is a high-level signal during the first period and the second period and is a low-level signal during other periods; the first clock signal is a low-level signal during the first period, the third period, and the fifth period and is a high-level signal during the second period, the fourth period, and the sixth period; the second clock signal is a high-level signal during the first period, the third period, and the fifth period and is a low-level signal during the second period, the fourth period, and the sixth period.

15. A gate drive circuit, comprising: N cascaded shift registers SR(i); wherein an output signal terminal of a k-th shift register SR(k) is connected with an input signal terminal of a (k+1)-th shift register SR(k+1); 1≤k≤N−1, N>1; a shift register according to claim 12 is adopted for at least one shift register SR(i) in the N shift registers; 1≤i≤N.

16. The shift register according to claim 1, wherein
the fourth control module comprises an eighth transistor and a ninth transistor, a control electrode of the eighth transistor is connected with the first clock signal terminal, a first electrode of the eighth transistor is connected with the first power supply signal terminal, a second electrode of the eighth transistor is connected with the fourth node, a control electrode of the ninth transistor is connected with the second clock signal terminal, a first electrode of the ninth transistor is connected with the second power supply signal terminal, and a second electrode of the ninth transistor is connected with the fourth node.

17. The shift register according to claim 16, wherein
all transistors comprised in the shift register are oxide thin film transistors.

18. The shift register according to claim 16, wherein
when all transistors in the shift register are N-type transistors, one work cycle of the shift register comprises following periods: a first period, a second period, a third period, a fourth period, and a fifth period and a sixth period which appear alternately for many times;
the first power supply signal and the second power supply signal are Direct Current (DC) signals, the first power supply signal is a high-level signal, the second power supply signal is a low-level signal, the input signal is a pulse signal, and the first clock signal and the second clock signal are periodic pulse signals; the input signal is a high-level signal during the first period and the second period and is a low-level signal during other periods; the first clock signal is a low-level signal during the first period, the third period, and the fifth period and is a high-level signal during the second period, the fourth period, and the sixth period; the second clock signal is a high-level signal during the first period, the third period, and the fifth period and is a low-level signal during the second period, the fourth period, and the sixth period.

19. A gate drive circuit, comprising: N cascaded shift registers SR(i); wherein an output signal terminal of a k-th shift register SR(k) is connected with an input signal terminal of a (k+1)-th shift register SR(k+1); 1≤k≤N−1, N>1; a shift register according to claim 1 is adopted for at least one shift register SR(i) in the N shift registers; $1 \leq i \leq N$.

20. A display apparatus, comprising a gate drive circuit according to claim 19.

\* \* \* \* \*